(12) United States Patent
Suarez Segovia et al.

(10) Patent No.: US 12,727,479 B2
(45) Date of Patent: Sep. 1, 2026

(54) METHOD FOR MANUFACTURING INTEGRATED CIRCUITS FROM A SEMICONDUCTOR SUBSTRATE WAFER

(71) Applicants: STMicroelectronics (Crolles 2) SAS, Crolles (FR); STMicroelectronics (Rousset) SAS, Rousset (FR)

(72) Inventors: Carlos Augusto Suarez Segovia, Seyssinet-Pariset (FR); David Parker, Greasque (FR); Chantal Trouiller, Grenoble (FR); Alexandre Malherbe, Trets (FR); Stephan Niel, Meylan (FR)

(73) Assignees: STMicroelectronics (Crolles 2) SAS, Crolles (FR); STMicroelectronics (Rousset) SAS, Rousset (FR)

( * ) Notice: Subject to any disclaimer, the term of this patent is extended or adjusted under 35 U.S.C. 154(b) by 666 days.

(21) Appl. No.: 18/094,069

(22) Filed: Jan. 6, 2023

(65) Prior Publication Data

US 2023/0223358 A1 Jul. 13, 2023

(30) Foreign Application Priority Data

Jan. 10, 2022 (FR) ...................................... 2200152

(51) Int. Cl.
*H10W 42/00* (2026.01)
*H10P 54/00* (2026.01)

(52) U.S. Cl.
CPC ........... *H10W 42/121* (2026.01); *H10P 54/00* (2026.01); *H10W 42/00* (2026.01)

(58) Field of Classification Search
None
See application file for complete search history.

(56) References Cited

U.S. PATENT DOCUMENTS 5,831,330 A * 11/1998 Chang .................. H01L 23/585 257/620
6,982,477 B2 * 1/2006 Adan .................. H10W 42/00 257/659

(Continued)

FOREIGN PATENT DOCUMENTS

CN 104299898 A 1/2015
CN 111801788 A 10/2020

(Continued)

OTHER PUBLICATIONS

CN First Office Action and Search Report for counterpart CN Appl. No. 202310028099.5, report dated Jun. 19, 2025, 8 pgs.

(Continued)

*Primary Examiner* — Erik T. K. Peterson
(74) *Attorney, Agent, or Firm* — Crowe & Dunlevy LLC

(57) ABSTRACT

Integrated circuits are supported by a semiconductor substrate wafer. Each integrated circuit includes an electrically active area. A thermally conductive protective structure is formed around the active areas of the various integrated circuits along scribe paths. The protective structure is located between the electrically active areas of the integrated circuits and a laser ablation area of the scribe paths. Separation of the integrated circuits is performed by scribing the semiconductor substrate wafer along the scribe paths. The process for scribing includes performing a laser ablation in the laser ablation area and then performing one of an etching or a physical scribing.

22 Claims, 3 Drawing Sheets

(56) References Cited

U.S. PATENT DOCUMENTS 8,048,778 B1* 11/2011 Ku .......................... H10P 54/00 257/E21.599
2005/0093169 A1* 5/2005 Kajita .................. H01L 23/562 257/774
2006/0020250 A1* 1/2006 Chester ............ A61F 13/53747 604/378
2006/0022224 A1* 2/2006 Hiroi ..................... H01L 23/522 257/E21.582
2008/0179710 A1* 7/2008 Yip ..................... H01L 21/3043 257/E23.179
2008/0277765 A1* 11/2008 Lane .................... H10D 62/117 257/E21.546
2009/0014882 A1* 1/2009 Ito ......................... H01L 23/562 257/E23.141
2009/0170288 A1* 7/2009 Ito ........................... H10P 54/00 257/E21.599
2009/0321890 A1* 12/2009 Jeng ...................... H01L 23/562 257/E23.193
2010/0078769 A1* 4/2010 West ..................... H01L 23/562 257/E23.179
2010/0123219 A1* 5/2010 Chen ...................... B23K 26/40 257/E23.08
2011/0127647 A1* 6/2011 Tsukakoshi ........... H10W 46/00 257/E23.179
2012/0038028 A1* 2/2012 Yaung ..................... H01L 21/78 257/E23.18
2014/0239455 A1* 8/2014 Ishii ...................... H01L 23/562 257/622
2014/0264767 A1* 9/2014 Gratz .................... H01L 23/585 257/620
2016/0204074 A1* 7/2016 Lin ....................... H01L 23/562 257/76
2016/0211227 A1* 7/2016 Wagner ................. H01L 23/562
2017/0012002 A1 1/2017 Meiser et al.
2017/0032981 A1 2/2017 Chinnusamy
2017/0256638 A1* 9/2017 Macelwee ........... H01L 23/3171
2017/0323835 A1* 11/2017 Ogawa .................. H01L 23/562
2018/0033695 A1* 2/2018 Chang ................... H01L 23/544
2018/0269162 A1* 9/2018 Takahashi ........... H10W 42/121
2019/0371741 A1 12/2019 Wang et al.
2020/0135564 A1* 4/2020 Zundel .................... H10P 54/00
2020/0312715 A1* 10/2020 Choi ................. H01L 21/76838
2021/0193655 A1 6/2021 Or-Bach et al.
2021/0296271 A1* 9/2021 Jeong ................... H10K 77/111
2021/0407854 A1* 12/2021 Jeong ................... B23K 26/402
2022/0005733 A1* 1/2022 Jeong .................. H01L 23/3171
2022/0051993 A1* 2/2022 Chen ..................... H01L 23/562
2023/0036280 A1* 2/2023 Lai ........................ H01L 23/562
2023/0067386 A1* 3/2023 Choi ..................... H01L 23/528

FOREIGN PATENT DOCUMENTS

CN 219917132 U 10/2023
JP 2008244401 A 10/2008
JP 2012164974 A 8/2012
JP 2021019180 A 2/2021
KR 1020110084829 A 7/2011

OTHER PUBLICATIONS

INPI Search Report and Written Opinion for priority application, FR 2200152, report dated Aug. 24, 2022, 10 pgs.

CN Second Office Action and Search Report for counterpart CN Appl. No. 202310028099.5, report dated Feb. 4, 2026, 5 pgs.

* cited by examiner

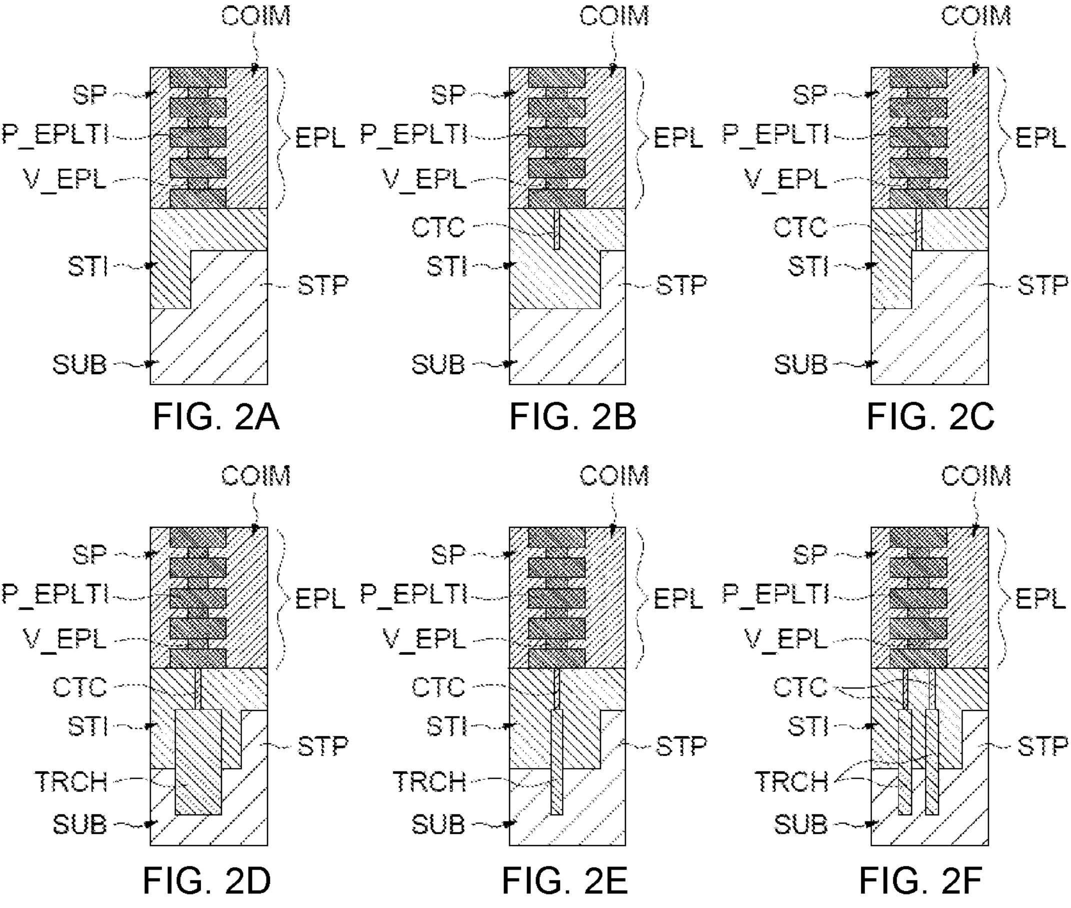
FIG. 2A FIG. 2B FIG. 2C
FIG. 2D FIG. 2E FIG. 2F
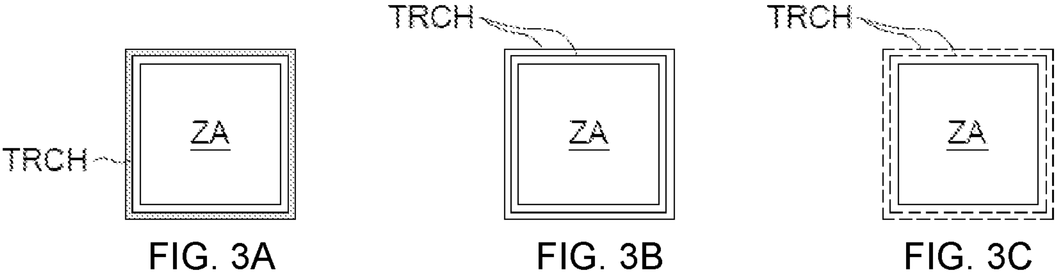
FIG. 3A FIG. 3B FIG. 3C

METHOD FOR MANUFACTURING INTEGRATED CIRCUITS FROM A SEMICONDUCTOR SUBSTRATE WAFER

PRIORITY CLAIM

This application claims the priority benefit of French Application for Patent No. 2200152, filed on Jan. 10, 2022, the content of which is hereby incorporated by reference in its entirety to the maximum extent allowable by law.

TECHNICAL FIELD

Embodiments and implementations relate to manufacturing integrated circuits on a semiconductor wafer.

BACKGROUND

Semiconductor substrate wafers are used as a support for the manufacture of integrated circuit components. The same semiconductor wafer can support several identical integrated circuits. Once the components of the integrated circuits have been manufactured, the integrated circuits are separated from each other in a singulation process by scribing (i.e., cutting through) pieces of the semiconductor wafer (commonly designated by "die") according to scribe paths (usually designated by "scribe line") bypassing the various integrated circuits.

There are different methods for singulating the different wafer pieces supporting the integrated circuits. It is, for example, possible to use a saw to saw the wafer along the scribe paths.

Other singulation methods use laser ablation (also known as "laser grooving") followed by chemical etching or physical scribing along the scribe paths.

In these singulation methods, the laser ablation forms a groove in the semiconductor wafer down to the level of the substrate, and then a chemical etching or physical scribing process is used to finalize the singulation of the wafer into separate the integrated circuits.

The etching may, for example, be a plasma etching ("plasma dicing"). Plasma etching has several advantages over sawing.

Indeed, plasma etching does not create vibrations during scribing and thus improves the quality of the scribe. Indeed, plasma etching is an action wherein the wafer undergoes a bombardment of ionized gas (plasma) in order to remove one or more layers. Plasma etching therefore allows to avoid applying mechanical pressure to the semiconductor wafer.

Plasma etching further allows to obtain a finer scribe so that it is possible to form a greater number of integrated circuits on the semiconductor wafer.

However, laser ablation can induce significant heat release that can generate thermal stresses in the semiconductor wafer.

However, plasma etching requires directly exposing the semiconductor wafer substrate to the plasma.

Metal structures cannot therefore be used in the center of the scribe paths to optimize laser ablation.

As a result, the integrated circuits are not protected against the thermal stresses that can result from the heat generated by the laser ablation, so that a deterioration of the integrated circuits is possible.

In particular, during scribing, the heat produced by the laser can cause degradation of the substrate. This substrate degradation can weaken the substrate. The weakening of the substrate can then generate unwanted lateral cracks in the substrate during plasma etching. However, lateral cracks can propagate towards the active parts of the integrated circuits and can therefore deteriorate them.

There is therefore a need to propose a solution allowing to protect the integrated circuits during scribing of the semiconductor wafer by laser ablation followed by chemical etching or physical scribing.

SUMMARY

According to one aspect, a method for manufacturing integrated circuits from a semiconductor substrate wafer comprises: forming integrated circuits, each integrated circuit including an electrically active area; forming a thermally conductive protective structure around the active areas of the various integrated circuits in scribe paths, the protective structure being located between the electrically active areas of said integrated circuits and a laser ablation area of the scribe paths; and then separating the integrated circuits by scribing the semiconductor substrate wafer along the scribe paths, wherein scribing comprises performing a laser ablation in the laser ablation area, followed by performing one of a chemical etching or a physical scribing.

The protective structure, being thermally conductive, allows to capture and then dissipate the heat produced by the laser ablation downstream of the laser with respect to the direction of movement of the laser. Thus, the protective structure allows to reduce the thermal stresses in the wafer. In this way, the protective structure allows to reduce the risk of the appearance of lateral cracks which can damage the active area of the integrated circuit.

Preferably, the formation of the protective structure includes a formation of a continuous or discontinuous stack of metal elements around the active areas of the various integrated circuits.

The stack of metal elements can be formed at least in part in a shallow isolation trench.

In an advantageous embodiment, the formation of the protective structure also includes a formation of a semiconductor substrate shoulder. The substrate shoulder allows to obtain a deeper trench which allows to obtain a deeper thermal isolation into the substrate and to limit, or even prevent, the propagation in the substrate of the lateral cracks which can be generated during plasma etching due to the heat generated by laser ablation.

Alternatively, advantageously, the formation of the protective structure further includes a formation of at least one polysilicon trench extending at least partially deep into the semiconductor substrate.

Forming a polysilicon trench allows to obtain a trench extending deeper into the substrate. Each trench provides deeper thermal isolation and prevents the propagation of lateral cracks towards the active area of the integrated circuit.

Each polysilicon trench may be formed in said shallow isolation trench.

The formation of said at least one polysilicon trench can be carried out simultaneously with the formation of polysilicon trenches for manufacturing other integrated circuit components, such as capacitors, in the active area of the integrated circuits, said at least one trench of the isolation structure being identical to the trenches used for the manufacture of said other components of the integrated circuits.

Preferably, the protective structure includes several polysilicon trenches.

In an advantageous embodiment, said at least one polysilicon trench extends continuously around the active area of the integrated circuits.

Preferably, when the protective structure includes several polysilicon trenches, the polysilicon trenches extend discontinuously around the active area of the integrated circuits, the trenches being arranged so that at least one trench faces the scribe path at any point around the active area of the integrated circuits.

In an advantageous implementation, the formation of each integrated circuit includes a formation of a chip edge ring surrounding said active area, the protective structure being formed between the laser ablation areas and the chip edge rings.

Each chip edge (or seal) ring may have mechanical protection properties and may seal the integrated circuit it surrounds against moisture.

Advantageously, the etching performed after the laser ablation is a plasma etching.

Preferably, the formation of the protective structure is carried out simultaneously with a formation of other components of the integrated circuit. Thus, the formation of the protective structure does not require the use of additional masks and is therefore inexpensive.

According to another aspect, provision is made of an integrated circuit formed on a semiconductor substrate, the integrated circuit including an electrically active area and a thermally conductive protective structure, said protective structure extending at the border of the integrated circuit around the electrically active area.

Such an integrated circuit can be an integrated circuit that can be obtained by implementing an integrated circuit manufacturing method as described above.

Preferably, the protective structure includes a continuous or discontinuous stack of metal elements around the active area of the integrated circuit.

The stack of metal elements can be formed at least partly in a shallow isolation trench.

In an advantageous embodiment, the protective structure also includes a semiconductor substrate shoulder around the active area of the integrated circuit.

Alternatively, advantageously, the protective structure further includes at least one polysilicon trench extending at least partially deep into the semiconductor substrate around the active area of the integrated circuit.

Preferably, the protective structure includes several polysilicon trenches.

In an advantageous embodiment, said at least one polysilicon trench extends continuously around the active area of the integrated circuits.

Preferably, when the protective structure includes several polysilicon trenches, the polysilicon trenches extend discontinuously around the active area of the integrated circuit, the trenches being arranged so that at least one trench faces the active area at any point around the active area.

In an advantageous embodiment, the integrated circuit further includes a chip edge (seal) ring surrounding said active area, the protective structure being formed around the chip edge ring.

Advantageously, the protective structure is composed of thermally conductive elements identical to other components of the integrated circuit.

BRIEF DESCRIPTION OF THE DRAWINGS

Other advantages and features of the invention will appear upon examining the detailed description of non-limiting implementations and embodiments and of the appended drawings wherein:

FIGS. 2A to 2F illustrate sectional views of different embodiments of a protective structure;

FIGS. 3A to 3C illustrates top views of different embodiments of a trench.

DETAILED DESCRIPTION

Figure 1:
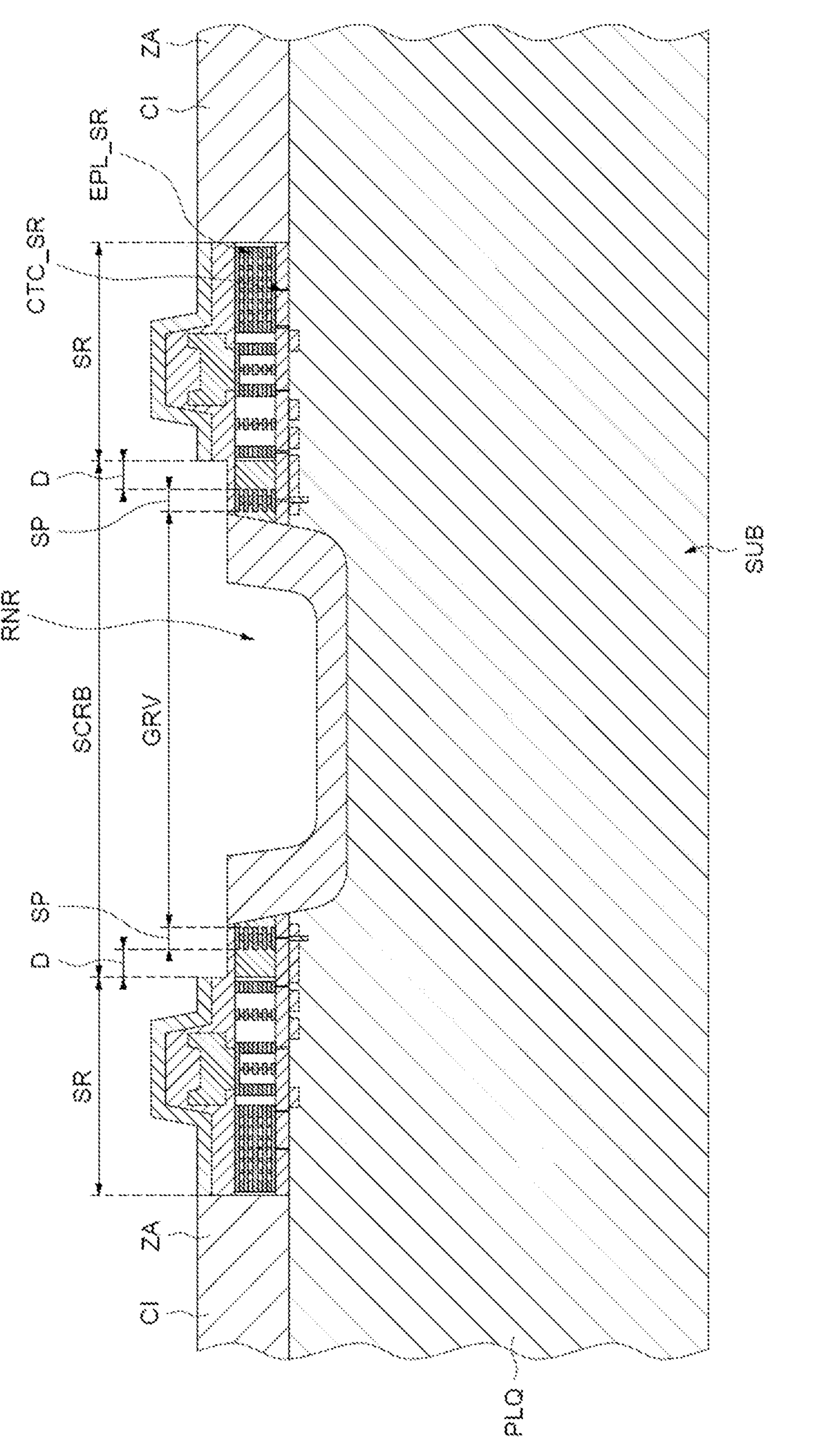
FIG. 1 illustrates a sectional view of an embodiment of a semiconductor substrate wafer.

FIG. 1 illustrates a sectional view of an embodiment of a semiconductor substrate SUB wafer PLQ. Several integrated circuits IC are formed in pieces of wafers (commonly designated by the term "die"). In FIG. 1, only two integrated circuits CI are partially represented.

Each integrated circuit CI includes an electrically active area ZA. The active area ZA of each integrated circuit CI is surrounded by a chip edge ring SR, for example a sealing ring. The chip edge ring SR can have mechanical protection properties and can seal the integrated circuit against moisture ingress to the integrated circuit.

The semiconductor wafer is configured to be scribed in order to separate (i.e., singulate) the integrated circuits (dice) from each other. In particular, the semiconductor wafer can be scribed by performing laser ablation followed by chemical etching or physical scribing. The etching may in particular be a plasma etching.

More particularly, the semiconductor wafer PLQ includes spaces forming scribe paths SCRB (commonly referred to as a "scribe line") between the various integrated circuits CI. The scribe paths SCRB extend around the chip edge rings SR of the integrated circuits IC. The scribe paths SCRB each include a laser ablation area GRV on which the laser ablation is performed. In FIG. 1, the laser ablation has already been performed to form a groove RNR extending into the scribe path SCRB.

In order to protect the active area of the integrated circuits, the semiconductor wafer PLQ includes protective structures SP all around the active areas of the various integrated circuits. In particular, the protective structures SP extend vertically between the laser ablation areas GRV and the active areas of the integrated circuits CI, in particular between the laser ablation areas GRV and the chip edge rings SR. The protective structure SP extends along the laser ablation areas GRV. The protective structure therefore adjoins the laser ablation area GRV. In particular, each protective structure SP is disposed at a distance D from the chip edge ring around which it extends. This distance D can be comprised between 0 μm and half the total width of the scribe paths SCRB. More particularly, it is preferable to place the protective structure as close as possible to the laser ablation area GRV.

These protective structures SP are configured to dissipate the heat produced by the laser ablation downstream of the laser with respect to the direction of movement of the laser, in order to reduce the risk of the appearance of lateral cracks which can deteriorate the active area of the integrated circuits after performing the plasma etching. The protective structures SP include elements formed by thermally conductive materials which extend all around the active areas of the integrated circuits and along the laser ablation areas. Each element thus allows to capture and then diffuse the heat produced by the laser ablation downstream of the laser with respect to the direction of movement of the laser.

FIGS. 2A to 2F illustrate sectional views of different embodiments of the protective structure SP.

In each embodiment, the protective structure SP includes a stack EPL of metal elements formed in inter-metal oxide layers COIM. These elements being metal are therefore thermally conductive and therefore allow to capture and then diffuse the heat produced by the laser ablation. The stack EPL includes an alternating succession of metal layers P_EPL and vias V_EPL connecting the different metal layers P_EPL. This stack EPL is formed in a back end of line (BEOL) part of the manufacture of integrated circuits. Here, the stack EPL is vertically continuous because it comprises vias V_EPL connecting the metal layers P_EPL, such as illustrated in the embodiment shown in FIG. 2A. Nevertheless, it is possible to provide a vertically discontinuous stack EPL that can comprise only metal layers P_EPL not connected to each other or else only vias V_EPL not connected to each other. It is also possible to provide a discontinuous stack EPL comprising metal layers P_EPL and vias V_EPL connecting only certain metal layers P_EPL.

As illustrated in the embodiments of FIGS. 2B, 2C, 2D, 2E and 2F, the protective structure SP can also include at least one metal element CTC, identical to the contacts used in the active areas of the integrated circuit or to contacts CTC_SR used in the chip edge rings. The metal element CTC can extend vertically so as to connect the stack EPL to the substrate SUB of the semiconductor wafer PLQ. This metal element CTC can be made of tungsten. The stack EPL and the metal element CTC allow to dissipate the heat produced by the laser ablation deeply towards the substrate SUB. The use of a metal element CTC allows to add a thermally conductive element in order to improve the dissipation of the heat produced by the laser ablation.

As illustrated in each embodiment of FIGS. 2A to 2F, the protective structure SP may also comprise a shoulder STP of the substrate SUB of the semiconductor wafer near the laser ablation area. The substrate SUB shoulder STP allows to obtain a deeper trench STI that allows thermal isolation deeper into the substrate and limits, or even prevents, the propagation in the substrate SUB of lateral cracks that can be generated during plasma etching due to the heat generated by laser ablation. In particular, the shoulder STP can be formed at the stack EPL or else between the stack EPL and the laser ablation area or else between the stack EPL and the chip edge ring. The shoulder STP can have a height of a few hundred nanometers for example.

Moreover, shown in the embodiment of FIG. 2C, the metal element CTC is connected directly to the shoulder STP of the substrate SUB. The protective structure SP therefore does not comprise trenches TRCH between the metal element CTC and the substrate SUB.

In the embodiments shown in FIGS. 2D, 2E and 2F, the protective structure further includes at least one trench TRCH formed partly in the shallow isolation trench STI and extending deep into the semiconductor substrate SUB.

Each trench TCRH is filled with a thermally conductive material. For example, each trench TRCH is filled with polysilicon. The polysilicon material allows to introduce a thermal resistance in the substrate. For example, polysilicon can be doped with doping concentrations between $10^{13}$ atoms/cm$^3$ and $10^{24}$ atoms/cm$^3$. Each trench extends deep into the semiconductor wafer substrate. As illustrated in the embodiments of FIGS. 2D and 2E, the width of a trench can vary. Forming a trench TRCH in a shallow isolation trench STI results in a trench TRCH extending deeper into the substrate SUB. Each trench TRCH allows to obtain deeper thermal isolation and to prevent the propagation of lateral cracks towards the active area ZA of the integrated circuit.

In the embodiments of FIGS. 2D and 2E, the protective structure includes a single trench. Alternatively, the protective structure may include several different trenches TRCH. Thus, as illustrated in the embodiment of FIG. 2F, the stack EPL can be connected to two different trenches TRCH by two metal elements CTC, for example.

More particularly, FIGS. 3A to 3C illustrate different embodiments of a trench TRCH in top view. As illustrated in the embodiments of FIGS. 3A and 3B, each trench TRCH may be continuous around the active area of the integrated circuit. In particular, the embodiment of FIG. 3A has a continuous trench having a large width as illustrated in the embodiment of FIG. 2D. The embodiment of FIG. 3B has two continuous trenches having a narrower width as shown in the embodiment of FIG. 2F.

Alternatively, as illustrated in the embodiment of FIG. 3C, when the structure includes several trenches, in particular thin trenches as illustrated in the embodiment of FIG. 2F, the trenches can be discontinuous. In the latter case, it is preferable to arrange the trenches TRCH so as to have at least one trench facing the active area at any point around the active area. This embodiment allows to simplify the manufacture of the trenches TRCH because the trenches TRCH are then composed of portions of limited length.

Figure 4:
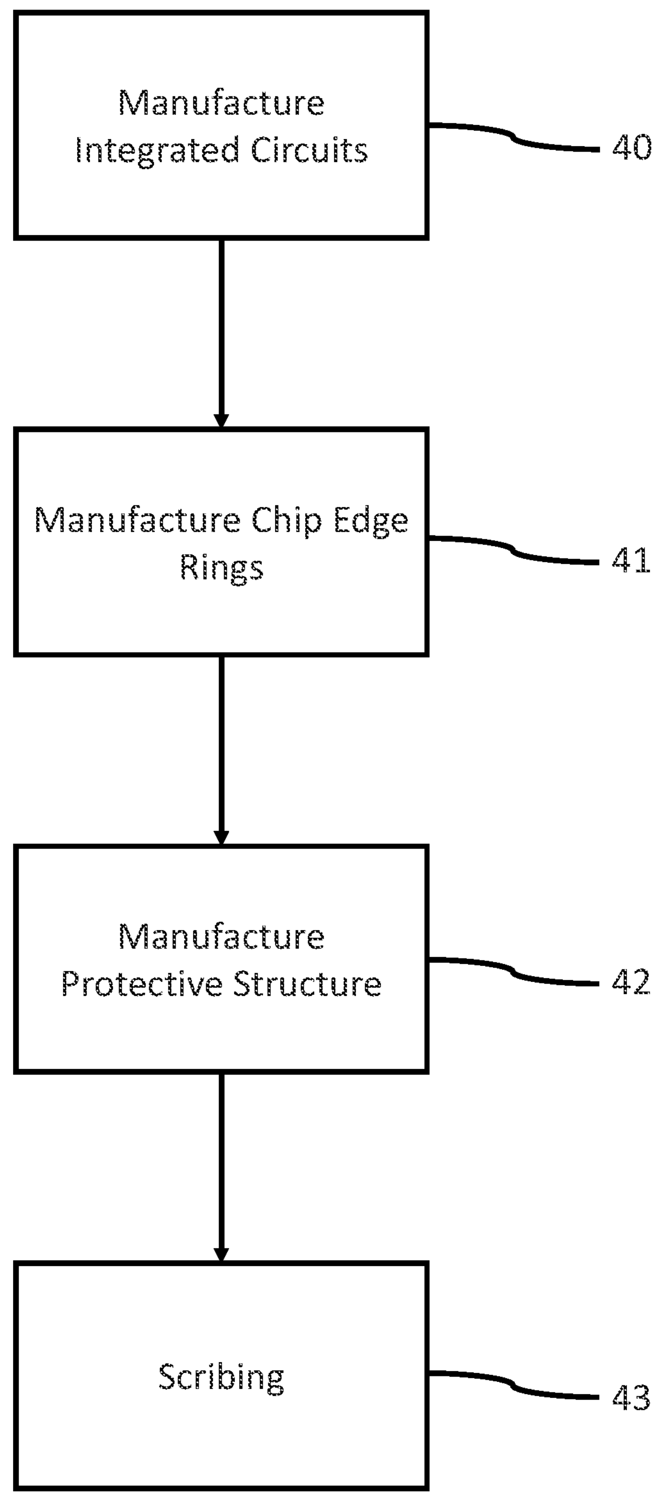
FIG. 4 illustrates step of a method for manufacturing integrated circuits from a semiconductor substrate wafer.

FIG. 4 illustrates a method for manufacturing integrated circuits from a semiconductor substrate SUB wafer PLQ.

The method comprises several steps 40, 41 and 42 (which may, for example, be carried out simultaneously). In particular, the method comprises manufacturing 40 the integrated circuits in the semiconductor substrate SUB wafer PLQ. The method also comprises manufacturing 41 chip edge rings around the active areas ZA of the integrated circuits. The method also comprises manufacturing 42 a protective structure SP according to one of the embodiments described above.

In particular, the formation 42 of the protective structure may comprise the formation of at least one trench TRCH. The formation 42 of the protective structure may also further comprise a formation of the stack EPL and of at least one other metal element CTC connected or not to said at least one trench TRCH. As seen previously, the formation 42 of the protective structure SP is carried out with the formation of the integrated circuits CI. In particular, the formation of the trenches TRCH can be carried out simultaneously with a formation of trenches for manufacturing other components (not shown), such as capacitors in the integrated circuits CI, the trenches TRCH of the isolation structure being identical to the trenches used for the manufacture of said other components. Furthermore, the formation of the stack EPL and of said at least one metal element CTC can be carried out simultaneously with a formation of stacks and metal elements identical to the element CTC used for the manufacture of integrated circuits or chip edge rings SR. In particular, the stack EPL and said at least one metal element CTC can be formed at the same time as the stack EPL-SR and the metal element CTC_SR of the chip edge rings shown in FIG. 1.

The method then comprises a scribing 43 wherein the integrated circuits CI are separated from each other. In particular, the wafer is scribed by following the scribe paths. Scribing the wafer first comprises performing a laser ablation and then performing one of a chemical etching or a physical scribing (sawing or plasma etching, for example). The protective structure SP allows the heat produced by laser ablation to be dissipated deep into the substrate, in order to reduce the risk of cracks appearing in the semiconductor substrate during chemical etching or during physical scribing. After scribing, each integrated circuit includes on the border said protective structure SP which may have been partially damaged by the scribing.

The invention claimed is:

1. A method for manufacturing integrated circuits from a semiconductor substrate wafer, comprising:

forming integrated circuits in said semiconductor substrate wafer, wherein each integrated circuit includes an electrically active area;

forming a thermally conductive protective structure around the electrically active area of the integrated circuits along scribe paths, wherein the thermally conductive protective structure is located between the electrically active areas of said integrated circuits and a laser ablation area of the scribe paths;

wherein forming the thermally conductive protective structure comprises:

forming a stack of metal elements around the electrically active areas of the integrated circuits; and forming at least one polysilicon trench below the thermally conductive protective structure and extending at least partially deep into the semiconductor substrate; and then separating the integrated circuits by scribing the semiconductor substrate wafer along the scribe paths, wherein scribing includes performing a laser ablation in the laser ablation area followed by performing one of an etching or a physical scribing.

2. The method according to claim 1, wherein the stack of metal elements is continuous around the electrically active areas.

3. The method according to claim 1, wherein the stack of metal elements is discontinuous around the electrically active areas.

4. The method according to claim 1, wherein the thermally conductive protective structure includes several polysilicon trenches.

5. The method according to claim 4, wherein the several polysilicon trenches extend discontinuously around the electrically active area of the integrated circuits, the several polysilicon trenches being arranged so that at least one polysilicon trench faces the scribe path at any point around the electrically active area of the integrated circuits.

6. The method according to claim 1, wherein said at least one polysilicon trench extends continuously around the electrically active area of the integrated circuits.

7. The method according to claim 1, further comprising forming a metal contact structure extending between a bottom of the thermally conductive protective structure and a top of the at least one polysilicon trench.

8. The method according to claim 1, wherein forming each integrated circuit comprises forming a chip edge ring surrounding said electrically active area, and wherein the thermally conductive protective structure is located between the laser ablation area and the chip edge ring.

9. The method according to claim 1, wherein the etching comprises a plasma etching.

10. The method according to claim 1, wherein forming the thermally conductive protective structure is carried out simultaneously with forming other components of the integrated circuit.

11. A method for manufacturing integrated circuits from a semiconductor substrate wafer, comprising:

forming integrated circuits in said semiconductor substrate wafer, wherein each integrated circuit includes an electrically active area;

forming a thermally conductive protective structure around the electrically active area of the integrated circuits along scribe paths, wherein the thermally conductive protective structure is located between the electrically active areas of said integrated circuits and a laser ablation area of the scribe paths;

wherein forming the thermally conductive protective structure comprises:

forming a stack of metal elements around the electrically active areas of the integrated circuits;

forming a shoulder in semiconductor substrate wafer around the electrically active areas of the integrated circuits; and forming at least one polysilicon trench below the thermally conductive protective structure and extending at least partially deep into the semiconductor substrate at a location adjacent the semiconductor substrate shoulder; and then separating the integrated circuits by scribing the semiconductor substrate wafer along the scribe paths, wherein scribing includes performing a laser ablation in the laser ablation area followed by performing one of an etching or a physical scribing.

12. The method according to claim 11, further comprising forming a metal contact structure extending between a bottom of the thermally conductive protective structure and a top of the at least one polysilicon trench.

13. A method for manufacturing integrated circuits from a semiconductor substrate wafer, comprising:

forming integrated circuits in said semiconductor substrate wafer, wherein each integrated circuit includes an electrically active area;

forming a thermally conductive protective structure around the electrically active area of the integrated circuits along scribe paths, wherein the thermally conductive protective structure is located between the electrically active areas of said integrated circuits and a laser ablation area of the scribe paths;

wherein forming the thermally conductive protective structure comprises;

forming a shoulder in the semiconductor substrate wafer around the electrically active areas of the various integrated circuits;

forming a stack of metal elements around the electrically active areas of the integrated circuits; and forming at least one polysilicon trench below the thermally conductive protective structure and extending at least partially deep into the semiconductor substrate; and then separating the integrated circuits by scribing the semiconductor substrate wafer along the scribe paths, wherein scribing includes performing a laser ablation in the laser ablation area followed by performing one of an etching or a physical scribing.

14. The method according to claim 13, wherein the stack of metal elements is continuous around the electrically active areas.

15. The method according to claim 13, wherein the stack of metal elements is discontinuous around the electrically active areas.

16. The method according to claim 13, wherein the thermally conductive protective structure includes several polysilicon trenches.

17. The method according to claim 16, wherein the several polysilicon trenches extend discontinuously around the electrically active area of the integrated circuits, the several polysilicon trenches being arranged so that at least one polysilicon trench faces the scribe path at any point around the electrically active area of the integrated circuits.

18. The method according to claim 13, wherein said at least one polysilicon trench extends continuously around the electrically active area of the integrated circuits.

19. The method according to claim 13, further comprising forming a metal contact structure extending between a bottom of the thermally conductive protective structure and a top of the at least one polysilicon trench.

20. The method according to claim 13, wherein forming each integrated circuit comprises forming a chip edge ring surrounding said electrically active area, and wherein the thermally conductive protective structure is located between the laser ablation area and the chip edge ring.

21. The method according to claim 13, wherein the etching comprises a plasma etching.

22. The method according to claim 13, wherein forming the thermally conductive protective structure is carried out simultaneously with forming other components of the integrated circuit.

* * * * *